United States Patent
Ano

(10) Patent No.: US 7,233,074 B2
(45) Date of Patent: Jun. 19, 2007

(54) SEMICONDUCTOR DEVICE WITH IMPROVED CONTACTS

(75) Inventor: Kazuaki Ano, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/201,717

(22) Filed: Aug. 11, 2005

(65) Prior Publication Data

US 2007/0035023 A1   Feb. 15, 2007

(51) Int. Cl.
H01L 23/48       (2006.01)
H01L 23/52       (2006.01)
H01L 29/40       (2006.01)

(52) U.S. Cl. .................. 257/781; 257/738; 257/748
(58) Field of Classification Search ............. 257/734, 257/777–781, 738, 748
See application file for complete search history.

(56) References Cited

U.S. PATENT DOCUMENTS

| | | | |
|---|---|---|---|
| 6,224,690 B1 | 5/2001 | Andricacos et al. | |
| 6,596,621 B1 | 7/2003 | Copeland et al. | |
| 6,642,079 B1 | 11/2003 | Liu et al. | |
| 6,879,041 B2 * | 4/2005 | Yamamoto et al. | ......... 257/737 |
| 2003/0096495 A1 | 5/2003 | Ihara et al. | |
| 2003/0121959 A1 | 7/2003 | Yamaguchi et al. | |
| 2003/0143419 A1 | 7/2003 | Nakamura | |
| 2003/0193094 A1 | 10/2003 | Takahashi et al. | |
| 2004/0026769 A1 | 2/2004 | Nakamura | |
| 2004/0155336 A1 | 8/2004 | Yamaguchi et al. | |

OTHER PUBLICATIONS

Charles A. Harper, Electronic Packaging and Interconnection Handbook, 2000, McGraw-Hill, Third Edition, p. 4.12.*
Kazuaki Ano "High Reliability Solder Joint with Multilayer Structure" U.S. Appl. No. 10/706,147, filed Nov. 12, 2003.

* cited by examiner

*Primary Examiner*—Monica Lewis
(74) *Attorney, Agent, or Firm*—Yingsheng Tung; Wade James Brady, III; Frederick J. Telecky, Jr.

(57) ABSTRACT

A device with a solder joint made of a copper contact pad (210) of certain area (202) and an alloy layer (301) metallurgically attached to the copper pad across the pad area. The alloy layer contains copper/tin alloys, which include $Cu_6Sn_5$ intermetallic compound, and nickel/copper/tin alloys, which include $(Ni,Cu)_6Sn_5$ intermetallic compound. A solder element (308) including tin is metallurgically attached to the alloy layer across the pad area. No fraction of the original thin nickel layer is left after the reflow process. Copper/tin alloys help to improve the drop test performance, nickel/copper/tin alloys help to improve the life test performance.

2 Claims, 2 Drawing Sheets

SEMICONDUCTOR DEVICE WITH IMPROVED CONTACTS

FIELD OF THE INVENTION

The present invention is related in general to the field of metallurgical systems with application to electronic systems and semiconductor devices, and more specifically to the structure of semiconductor devices with copper-metallized contact pads and their reliability under accelerated stress tests.

DESCRIPTION OF THE RELATED ART

Among the semiconductor device packages for surface mount assembly, ball grid array (BGA) packages enjoy an ever increasing popularity. They can be used in many customer products and lend themselves to the ongoing trend of miniaturization. The solder elements, distributed over the whole package area, offer high numbers of input/output terminals. In addition, the solder elements offer the opportunity of board attach technology at very low failure rate ("6 sigma processing").

Recently, however, there are challenging requirements affecting BGA packages. To name just a few: More and more, the solder elements are required to be free of lead (for environmental reasons); this requirement causes metallurgical challenges. The contact pads have copper as its base metal; this choice creates metallurgical interface challenges for the solder elements. The ever decreasing feature size of the package components creates new hurdles to pass the accelerated stress tests at acceptable survival rates; for instance, accelerated life tests at elevated temperatures and in moist environment become more challenging. Device products containing BGA packages are spreading into more and more customer applications; often, these applications create more stringent or even altogether new acceptance tests. As a recent example, wireless phone applications brought about the requirement to withstand phone drop tests in order to demonstrate that the solder joints of the BGA packages remain reliable after the test.

SUMMARY OF THE INVENTION

Applicant recognizes a need for a flexible, yet low-cost and robust methodology to fabricate devices with solder joints, especially semiconductor packages, so that the joints bestow application-specific mechanical and thermal reliability to the devices and the devices will pass product-specific tests.

One embodiment of the invention is a device with a solder joint made of a contact pad of certain area and an alloy layer metallurgically attached to the contact pad across the pad area. The surface of the contact pad has copper. The alloy layer includes copper/tin alloys and copper/nickel/tin alloys over the contact area. The copper/tin alloys include $Cu_6Sn_5$ intermetallic compound. The copper/nickel/tin alloys include $(Ni, Cu)_6Sn_5$ intermetallic compound. A solder element including tin is metallurgically attached to the alloy layer across the pad area.

The first alloys, dominated by copper/tin alloys, help to improve the drop test performance to the best level achieved by solder joints with copper pads. The second alloys, dominated by nickel-containing alloys, help to improve the life test performance by slowing the aging conditions.

A preferred method of forming the desired number, distribution, and thickness of the alloy regions in the above-described embodiment is to deposit a thin nickel layer of pre-determined thickness over the copper contact pad, to attach a tin-containing solder element to the nickel layer, and to reflow the solder according to a selected time-temperature profile.

In another embodiment of the invention, the alloy layer may include gold or palladium.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
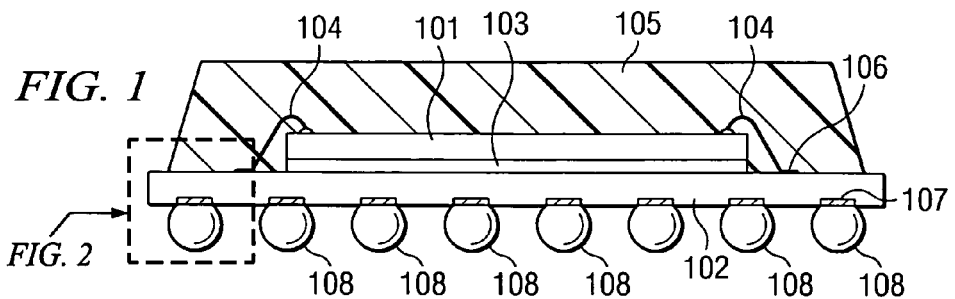
FIG. 1 illustrates a schematic cross section of a semiconductor device of the ball grid array (BGA) type having solder elements for external connections.

FIG. 1 illustrates schematically a representative of the large family of ball grid array (BGA) semiconductor devices. Semiconductor chip 101 is assembled on substrate 102 by using chip attach material 103 for mechanical attachment and bonding wires 104 for electrical connections. The assembly is encapsulated, typically in molding compound 105.

Substrate 102 has one or more patterned metal layers for internal interconnection (not shown in FIG. 1) especially to create connecting lines between the wire stitch bond sites 106 and the contact pads 107 for external connections. The metal layers are separated by insulating layers. Solder elements 108 are attached to the contact pads 107. The reliability of this solder attachment under various test and use conditions deserves special consideration.

Figure 2:
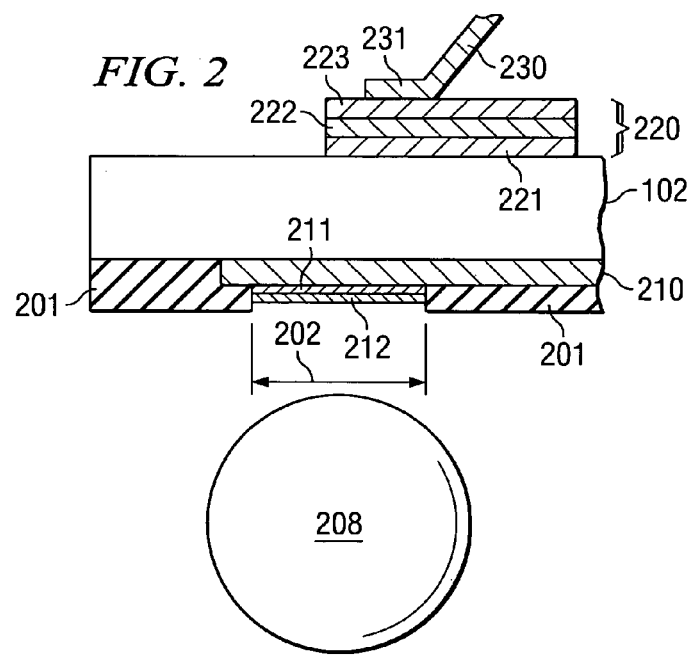
FIG. 2 is a schematic cross section of portion "A" (FIG. 1) of the substrate showing the detail of a contact pad before solder element attachment.
Figure 3:
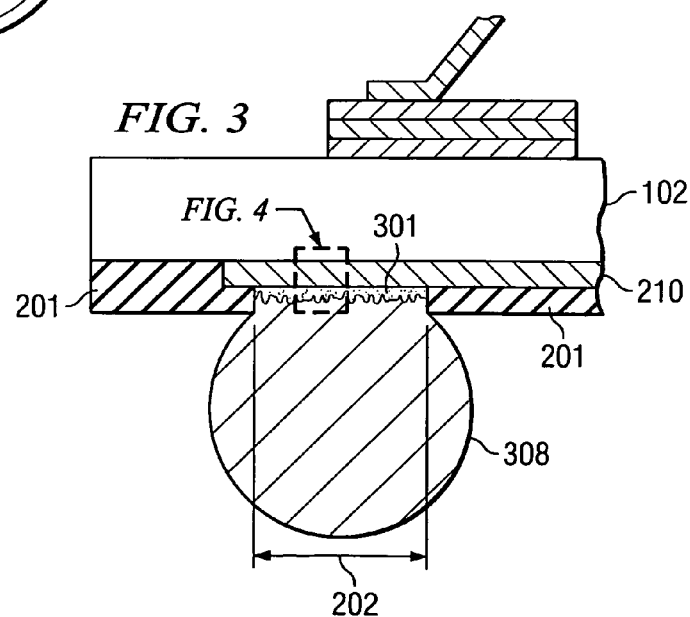
FIG. 3 is a schematic cross section of portion "A" (FIG. 1) of the substrate showing the detail of a contact pad after reflow of the solder element.

Portion "A" of the device is shown in more detail in FIGS. 2 and 3. FIG. 2 illustrates a device contact pad before the reflow of solder element 208, and FIG. 3 after the reflow process. In FIG. 2, substrate 102 has an insulating surface layer 201, which is often referred to as a solder mask. A window of width 202 has been opened in solder mask 201, which exposes a portion of the interconnecting metallization 210 of the substrate and thus defines the contact area. Metallization 210 is made of copper, and the area of the exposed copper is determined by the width 202 of the solder mask window.

A layer 211 of nickel is deposited over the area of the exposed copper; in addition, a layer 212 of a noble metal such as gold or palladium is deposited over the nickel layer. The thickness of the nickel layer in this embodiment is between about 0.01 and 0.3 μm; a preferred thickness range is 0.12±0.04 μm. The thickness of the gold layer is between about 0.1 and 1.0 μm; a preferred thickness range is 0.5±0.25 μm.

Solder reflow element 208 contains tin; in addition, it may contain one or more of the metals selected from a group consisting of lead, silver, bismuth, indium, zinc, copper, nickel and antimony. For the nickel layer thickness in this embodiment, the amount of tin, and other reflow metals, in reflow element 208 is much larger than the amount of nickel.

As FIG. 2 shows, substrate 102 has one or more pads 220 on the substrate surface opposite to the contact pad 202; these pads serve as bond pads for the connection wires 230 to the semiconductor chip bond pads. Since wire 230 is preferably made of gold and pad 220 preferably is intended for gold wire stitches 231, pad 220 is preferably made of a stack of layers including copper layer 221, nickel layer 222, and gold layer 223.

FIG. 3 illustrates the device contact pad after the reflow of the solder element 208. 210 is the copper line with the contact pad exposed by the window of width 202 in solder resist 201. Width 202 defines the copper contact area.

Metallurgically attached to the copper, across the area, is an alloy layer 301, which includes tin, copper and nickel. Region "B" of FIG. 3 is enlarged in FIG. 4. In order to achieve the best reliability performance, the alloy should consume the entire deposited nickel layer in the contact area. Metallurgically attached to alloy layer 301 is reflow element 308 with tin as its main component.

Figure 4:
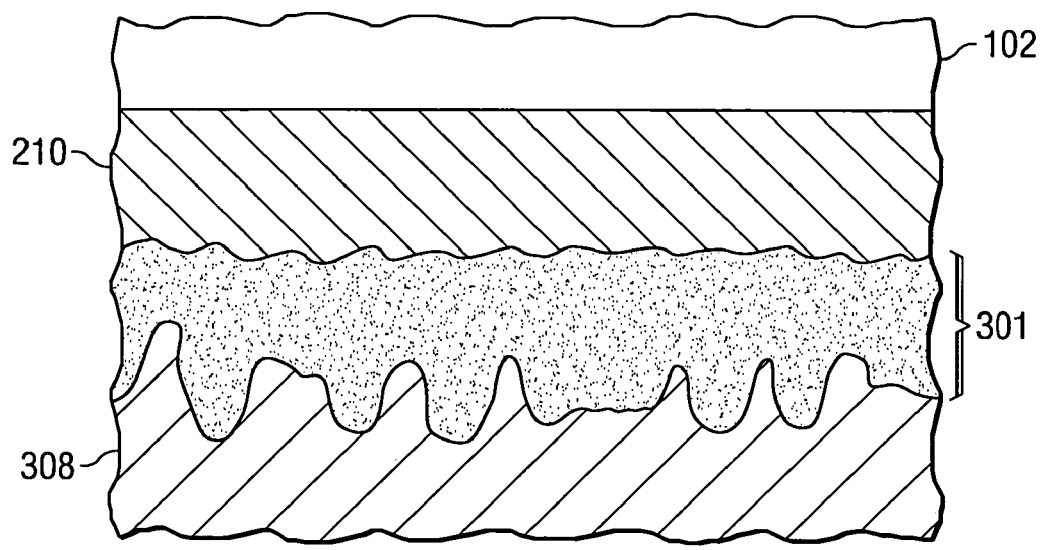
FIG. 4 is a schematic cross section of portion "B" (FIG. 3) of a solder joint.

In FIG. 4, on an insulating portion of substrate 102 is a portion of the copper layer 210 in the copper contact area. Metallurgically attached to copper layer 210 is alloy layer 301, and metallurgically attached to alloy layer 301 is a portion of reflow element 308, containing mainly tin.

Alloy layer 301 comprises copper/tin alloys and copper/nickel/tin alloys. The copper/tin alloys comprise a high percentage of $Cu_6Sn_5$ intermetallic compound, frequently in scallop-type outline. The nickel/copper/tin alloys comprise a high percentage of $(Ni, Cu)_6Sn_5$ intermetallic compound, frequently with crystallites spalled off into the alloy layer.

In embodiments, which have gold as a component of the alloys, the alloys comprise a high percentage of $(Cu, Ni, Au)_6Sn_5$ intermetallic compound. With the latter intermetallic compound, the thickness of the alloy layer is preferably between 2.0 and 3.0 μm.

The nickel-containing alloys have consumed all available nickel from the original nickel layer so that no fraction of the nickel layer is left after the alloy formation (reflow) process.

Figure 5:
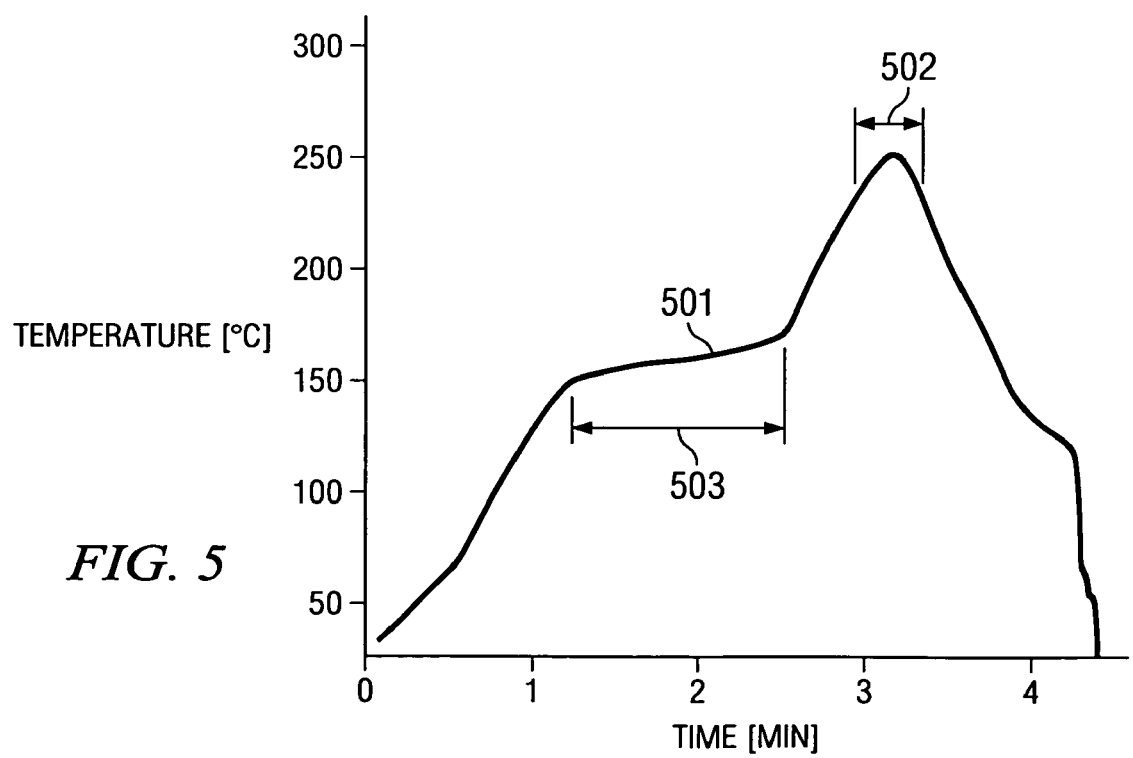
FIG. 5 illustrates an example of a time-temperature profile for a copper contact with a thin nickel layer to reflow tin solder and create copper/tin and nickel/tin, nickel/copper/tin alloy regions.

A pre-determined ratio between copper/tin alloys and nickel/copper/tin alloys can be manufactured by selecting the values of two parameters: the thickness of the nickel layer and the time-temperature profile of the reflow process. An example of a preferred time-temperature sequence 501 for a nickel layer in the 0.1±0.05 μm thickness range is reproduced in FIG. 5 (temperature measured in ° C., time in minutes). As can be seen, the profile has a pre-heat range 501 between about 130 and 170° C. of about 1 to 2 min, and a high temperature range 502 above about 230° C. of about ¼ to ¾ min.

Quantitative investigations by the inventor have shown that copper/tin alloys help to improve the drop test performance of the assembled device to the best level achieved by solder joints with copper pads. On the other hand, nickel-containing alloys, obtained from a starting nickel layer thickness of approximately 0.1 μm, improve the life test performance of the finished device characteristics by slowing the aging conditions so much that the device characteristics remain approximately constant over the expected device life span.

In other embodiments of the invention, the alloy layer 301 together with the reflowed tin solder element 308 may include dissolved noble metals such as gold or palladium. The noble metal, shown in FIG. 2 as a deposited layer, is dissolved in the process step of reflowing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, even thinner nickel layers may be employed—just enough nickel to shield the copper from oxidation. It is therefore intended that the appended claims encompass any such modification.

I claim:

1. A device comprising:
   a semiconductor chip;
   a substrate, on which the chip is assembled, having contacts for external connections; each contact including:
   a contact area with copper; and
   an alloy layer covering the contact area, the alloy layer including gold, copper/tin alloys, and copper/nickel/tin alloys wherein the dominant alloy comprises $(Cu, Ni, Au)_6Sn_5$ intermetallic compound, metallurgically attached to the copper area and substantially free of regions of unalloyed nickel; and a reflow element comprising tin metallurgically attached to the alloy layer.

2. The device according to claim 1 wherein the thickness of the intermetallic compound $(Cu, Ni, Au)_6Sn_5$ is between about 2.0 and 3.0 μm.

* * * * *